(12) United States Patent
Sanford et al.

(10) Patent No.: US 10,292,505 B2
(45) Date of Patent: May 21, 2019

(54) PRODUCT DEMONSTRATION FIXTURE FOR A PORTABLE ELECTRONIC DEVICE

(71) Applicant: Apple Inc., Cupertino, CA (US)

(72) Inventors: Emery A. Sanford, Cupertino, CA (US); David G. Havskjold, Cupertino, CA (US); Steven G. Herbst, Cupertino, CA (US); Anthony S. Montevirgen, Cupertino, CA (US); Jeffrey J. Terlizzi, Cupertino, CA (US); Tyson B. Manullang, Cupertino, CA (US); Charles A. Schwalbach, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 417 days.

(21) Appl. No.: 14/634,145

(22) Filed: Feb. 27, 2015

(65) Prior Publication Data
US 2015/0245722 A1 Sep. 3, 2015

Related U.S. Application Data

(60) Provisional application No. 61/946,691, filed on Feb. 28, 2014, provisional application No. 61/968,223, (Continued)

(51) Int. Cl.
*A47F 5/16* (2006.01)
*A47F 3/00* (2006.01)
(Continued)

(52) U.S. Cl.
CPC ............... *A47F 5/16* (2013.01); *A47F 3/005* (2013.01); *A47F 3/007* (2013.01); *A47F 7/00* (2013.01);
(Continued)

(58) Field of Classification Search
USPC ......................................................... 434/379
See application file for complete search history.

(56) References Cited

U.S. PATENT DOCUMENTS

| 6,601,349 B1 * | 8/2003 | Corden | ................ E04B 2/7453 52/126.4 |
| D716,288 S * | 10/2014 | O'Heron | ...................... D14/253 |

(Continued)

FOREIGN PATENT DOCUMENTS

| JP | H09190241 | 7/1997 |
| JP | 2000081932 | 3/2000 |

(Continued)

OTHER PUBLICATIONS

"'Smart Signs' arrive at Apple Stores", accessed at: http://www.cnet.com/pictures/smart-signs-arrive-at-apple-stores-photos/2/?query=smart+signs (May 22, 2011).*

(Continued)

*Primary Examiner* — James Hull
(74) *Attorney, Agent, or Firm* — Sterne, Kessler, Goldstein & Fox P.L.L.C.

(57) ABSTRACT

A retail electronic product demonstration fixture for demonstrating portable electronic devices. The product demonstration fixture may include an exhibition portion and a base portion. A portable electronic device offered for sale may be affixed to the exhibition portion. The base portion may include an electronic display, an auxiliary battery, and an auxiliary controller. The auxiliary controller may direct power from the auxiliary battery to the electronic display upon determining that a battery within the electronic display has fallen below a particular selected level. Similarly the auxiliary controller may direct power from the auxiliary battery to the portable electronic device offered for sale upon (Continued)

determining that a battery within the portable electronic device has fallen below a selected level.

15 Claims, 14 Drawing Sheets

Related U.S. Application Data filed on Mar. 20, 2014, provisional application No. 62/048,206, filed on Sep. 9, 2014.

(51) Int. Cl.

| | |
|---|---|
| G06F 1/16 | (2006.01) |
| G06F 1/26 | (2006.01) |
| A47F 7/024 | (2006.01) |
| A47F 7/00 | (2006.01) |
| G09F 3/20 | (2006.01) |
| H05K 5/00 | (2006.01) |
| H05K 5/02 | (2006.01) |

(52) U.S. Cl.
CPC .......... *A47F 7/0246* (2013.01); *G06F 1/1632* (2013.01); *G06F 1/1633* (2013.01); *G06F 1/263* (2013.01); *G09F 3/208* (2013.01); *H05K 5/0086* (2013.01); *H05K 5/0204* (2013.01); *A47F 2005/165* (2013.01)

(56) References Cited

U.S. PATENT DOCUMENTS

| | | | |
|---|---|---|---|
| 8,905,763 B1 | 12/2014 | Hu et al. | |
| 2003/0047575 A1* | 3/2003 | Enkerlin | A45F 5/02 224/271 |
| 2003/0146736 A1* | 8/2003 | Kosuda | G04C 10/00 320/132 |
| 2007/0194918 A1* | 8/2007 | Rabinowitz | G08B 13/1961 340/568.2 |
| 2009/0309423 A1* | 12/2009 | Utsumi | H02J 7/0093 307/66 |
| 2010/0250816 A1* | 9/2010 | Collopy | G06F 1/1616 710/303 |
| 2010/0301881 A1* | 12/2010 | Dunn | G01R 27/205 324/691 |
| 2011/0062294 A1 | 3/2011 | Johnson et al. | |
| 2011/0089310 A1* | 4/2011 | Heintz | B60R 3/02 248/677 |
| 2012/0054401 A1* | 3/2012 | Cheng | G06F 1/1632 710/304 |
| 2012/0119909 A1* | 5/2012 | Rapp | A47F 7/024 340/568.2 |
| 2012/0120571 A1* | 5/2012 | Bisesti | G08B 13/1463 361/679.01 |
| 2012/0242592 A1* | 9/2012 | Rothkopf | G06F 1/1652 345/173 |
| 2012/0280810 A1 | 11/2012 | Wheeler | |
| 2012/0287563 A1 | 11/2012 | Onodera | |
| 2012/0293924 A1* | 11/2012 | Dolci | G06F 1/1632 361/679.01 |
| 2013/0058015 A1 | 3/2013 | Peng et al. | |
| 2013/0342342 A1* | 12/2013 | Sabre | G09F 13/18 340/509 |
| 2014/0055933 A1 | 2/2014 | Waki et al. | |
| 2014/0068498 A1 | 3/2014 | Olsen et al. | |
| 2015/0028797 A1* | 1/2015 | Miller | H02J 7/0042 320/103 |

FOREIGN PATENT DOCUMENTS

| | | |
|---|---|---|
| JP | 2003000405 | 1/2003 |
| JP | 2003150273 | 5/2003 |
| JP | 2003339493 | 12/2003 |
| JP | 2010277379 | 12/2010 |
| JP | 2012238452 | 12/2012 |
| JP | 2012238999 | 12/2012 |
| JP | 2013186795 | 9/2013 |
| JP | 2014166341 | 9/2014 |

OTHER PUBLICATIONS

International Preliminary Report on Patentability and Written Opinion of the International Searching Authority for International Patent Application No. PCT/US2015/017206 dated Sep. 6, 2016.
Notification of Reason(s) for Refusal issued in Japanese Patent Application No. 2016-570930, dated Jul. 31, 2017.

* cited by examiner

PRODUCT DEMONSTRATION FIXTURE FOR A PORTABLE ELECTRONIC DEVICE

CROSS-REFERENCE TO RELATED APPLICATIONS

This application is a nonprovisional patent application of and claims the benefit to U.S. Provisional Patent Application No. 61/946,691, filed Feb. 28, 2014 and titled "Product Demonstration Fixture for a Portable Electronic Device," U.S. Provisional Patent Application No. 61/968,223, filed Mar. 20, 2014 and titled "Product Demonstration Fixture for a Portable Electronic Device," and U.S. Provisional Patent Application No. 62/048,206 dated Sep. 9, 2014 and titled "Product Demonstration Fixture for a Portable Electronic Device," the disclosures of which are hereby incorporated herein in their entireties.

TECHNICAL FIELD

Embodiments described herein generally relate to retail product demonstration fixtures, and more particularly, to electronic product demonstration fixtures for demonstrating portable electronic devices.

BACKGROUND

Retail customers often value handling, operating, and inspecting electronic devices they are considering for purchase. Traditionally, in-store signage and product demonstration fixtures advertise a selected set of features and capabilities of an electronic device in order to encourage a potential customer to purchase the electronic device.

In many cases, the features advertised in-store may represent only a limited subset of the available features of a particular electronic device offered for sale, which in many cases are not the most compelling features relevant to the purchase decision of a particular potential customer. Accordingly, many retail stores dedicate a number of electronic devices for in-store customer demonstration so that a potential customer may handle, operate and inspect the electronic device.

In many examples, an in-store demonstration device may be attached to a fixture with a secure tether to prevent or deter theft. For example, a metal cable permanently affixed to an electronic display table may be permanently adhered to an in-store demonstration device. In many cases, the secure tether may detract from the demonstration experience. This problem may be especially undesirable for small form factor electronic devices.

In other examples, an electronic device may include features that require communication with another electronic device. For example, a Bluetooth accessory offered for sale may require a separate electronic device, such as a cellular telephone, to operate particular features of the Bluetooth accessory. These features may be desirable to demonstrate to a potential customer considering a purchase.

Accordingly, there may be a present need for an improved electronic merchandise display for an electronic device.

SUMMARY

Embodiments described herein may relate to, include, or take the form of an electronic merchandise display for facilitating in-store demonstration of a portable electronic device offered for sale. Certain embodiments may include a base portion and an exhibition portion. The exhibition portion (which may be or include an elevating attachment or fixture) may be adapted to mechanically secure the portable electronic device to the base portion in a position and orientation suitable for in-store demonstration. The base portion may include an electronic display configured for advertising purchase information related to the portable electronic device offered for sale. The electronic display may additionally be configured for providing simulated interaction with the portable electronic device offered for sale. In many embodiments simulated or actual interaction may occur over a physical cable or other tethered connection.

Some embodiments described herein may also relate to, include, or take the form of a battery operated electronic merchandise display for facilitating in-store demonstration of a portable electronic device offered for sale. Related embodiments may include an auxiliary battery within a base portion and configured to supply power to an electronic display and the portable electronic device offered for sale. In many embodiments, the battery operated electronic merchandise display may be adapted to operate constantly during business hours of a retail store without requiring recharging. For example, the battery operated electronic merchandise display may be adapted to operate for fourteen hours without recharging, in one embodiment.

Some embodiments described herein may also relate to, include, or take the form of methods of positioning and affixing a cover glass relative to a housing. The method may include the operations of positioning the cover glass over the housing, tuning alignment adjusters such that the cover glass and the housing are flush along at least one edge, and locking the alignment adjusters in place.

Some embodiments described herein may also relate to, include, or take the form of methods of replacing a first electronic device with a second electronic device on a product demonstration fixture. The method may include the operations of removing a foot portion from a base portion housing, decoupling a first elevating attachment from the base portion, removing the first elevating attachment from the base portion, decoupling a data cable from the elevating attachment and the base portion, inserting a replacement elevating attachment and re-coupling the data cable of the base portion to the replacement exhibition portion, coupling the replacement elevating attachment to the base portion, and re-attaching the foot portion to the base portion.

Some embodiments described herein may also relate to, include, or take the form of methods of presenting an electronic device offered for sale. The method may include the operations of affixing the portable electronic device to a base portion including an electronic display, communicably coupling the base portion to the electronic device, and providing a simulated interaction between the electronic device and a portable electronic device simulated on the electronic display.

BRIEF DESCRIPTION OF THE FIGURES

Reference will now be made to representative embodiments illustrated in the accompanying figures. It should be understood that the following descriptions are not intended to limit the embodiments to one preferred embodiment. To the contrary, it is intended to cover alternatives, modifications, and equivalents as may be included within the spirit and scope of the described embodiments as defined by the appended claims.

The use of the same or similar reference numerals in different figures indicates similar, related, or identical items.

DETAILED DESCRIPTION

Figure 1:
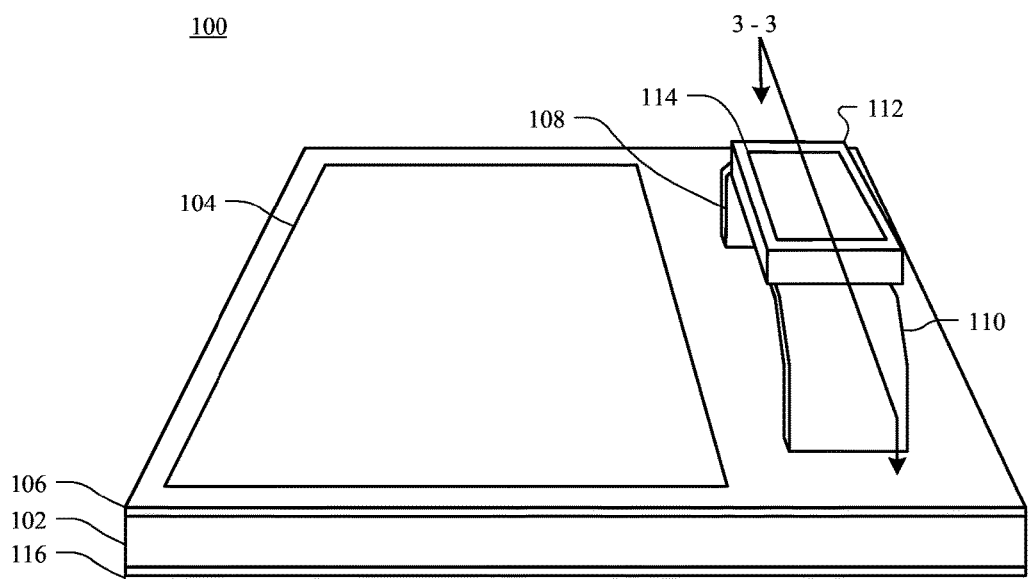
FIG. 1 depicts a front perspective view of an example product demonstration fixture for displaying and anchoring a portable electronic device.

Embodiments described herein may relate to, include, or take the form of a product demonstration fixture for facilitating in-store demonstration of a portable electronic device offered for sale.

Certain embodiments include a product demonstration fixture having a base portion and an exhibition portion. The elevating attachment may be adapted to mechanically secure the portable electronic device to the base portion in a position and orientation suitable for in-store demonstration. For example, the elevating attachment may orient the portable electronic device at a presentation angle optimized for viewing by a potential customer standing nearby an electronic display table. In one example in which the base portion, exhibition portion, or electronic device may include a partially reflective surface, the presentation angle may be selected to prevent a potential customer from being distracted by the customer's own reflection.

In certain embodiments, the base portion may include a cover. The cover may be made, for example, from a resilient and aesthetically pleasing material such as glass. The material may be selected, at least in part, based on one or more characteristics of the material that cause the material to be used for continued handling. For example, the material may be resistant to scratches, smudges, or collection of debris. The material may be selected, at least in part to include a texture that is pleasing to a potential customer. For example, in certain embodiments the material may include a low-friction surface that is adapted to allow a potential customer to easily and comfortably slide a finger across the surface.

In other examples, a high-friction surface may be desirable to discourage a user from touching certain portions of the cover. In another example, a high-friction surface may be desirable to prevent objects placed on the surface from moving along the surface. For example, a potential customer may place the potential customer's cellular phone along the cover surface. In such an example, it may be desirable to prevent the customer's phone from sliding off the cover surface, which may result in the customer's phone falling to the floor.

In this manner, any number of suitable materials and surface features may be used for the cover. One may appreciate that the type and quality of material selected for the cover may vary from embodiment to embodiment.

An optically opaque ink layer may be disposed on one or more surfaces of the cover in a pattern. For example, the ink may be disposed on a surface of the cover so as to define an aperture that is not optically obscured. This aperture may be sized to border an electronic display positioned within the base portion and below the cover. In this manner, such an aperture may be referred to as a display window.

In another example, an ink layer may be substituted for or supplemented by a colored dopant manufactured within the cover material itself. For example, the cover may incorporate a colored dopant to be partially, substantially, or entirely opaque. In such embodiments, the cover may be manufactured to include an optically transparent display window.

In many embodiments, the base portion may include an electronic display positioned below the cover and aligned with the display window. In many examples, the electronic display may include at least a processor, a display stack, and a memory. In still further examples, the electronic display may include a rechargeable battery.

In some examples, a display stack may include one or more layers of optically transparent material that may cooperatively provide for an electronically-controllable display adapted to present text, graphics, images, animations, video or other graphical elements to a potential customer. Such a display may be implemented with any suitable technology, including, but not limited to, liquid crystal display (LCD) technology, light emitting diode (LED) technology, organic light-emitting display (OLED) technology, organic electroluminescence (OEL) technology, or another type of display technology.

In other examples, the display stack may include one or more layers associated with an input device coupled to the processor. For example, one input device included within the display stack may be a touch-sensitive input device. In this manner, the display stack may take the form of a touch screen. In other examples, the input device may be a force sensor that is configured to detect a force applied to the display stack. In many examples, an input device that detects a touch or force input may be adapted to detect more than one touch of a user. In this manner, the display stack may include a multi-touch sensor so that a customer, or more than one customer, may interact with different portions of the electronic display at the same time.

The electronic display may also include a processor configured to dynamically modify the content of the display created by the display stack. In many examples, the processor can be a microprocessor, a central processing unit (CPU), an application-specific integrated circuit (ASIC), a digital signal processor (DSP), or combinations of such devices. In some embodiments, the processor can be circuitry including multiple discrete electronic components that is configured to modify the content of the display created by the display stack. In this manner, as described herein, the term "processor" is meant to encompass electronic circuitry, a single processor, multiple processors, multiple processing units, or other suitably configured computing elements adapted to affect changes to the display created by the display stack.

The electronic display may also include a memory coupled to the processor and adapted to store electronic data that can be used by the processor. For example, a memory can store electrical data or content such as, for example, audio and video files, documents and applications, device settings and user preferences, timing signals, data structures or databases, operating systems, firmware, and so on. The memory can be configured as any type of non-transitory or transitory memory such as random access memory, read-only memory, Flash memory, magnetic memory, removable memory, or other types of storage elements, or combinations of such devices.

In this manner, the processor and memory may be adapted to cooperate to dynamically vary the content of the display. For example, the processor may change the content of the display in response to instructions stored in the memory. In other examples, the processor may be adapted to vary the content of the electronic display in response to an external signal. External signals may be received by the processor wirelessly, via infra-red, or via a physical cable connection.

In certain further embodiments, the electronic display may be at least partially self-enclosed when assembled within the housing of the base. In other words, the electronic display may be a fully self-contained electronic device having a display that is entirely integrated with the base portion during assembly of the base portion. By way of example, the electronic display may be an off-the-shelf tablet computing device. In such an example, the tablet device may be removed from its housing (or otherwise manufactured without a housing), and may be integrated within the base portion during assembly of the base portion.

Further embodiments may include a removable electronic display. For example, the base portion may disassemble such that the electronic display may be removed and replaced from time to time. Some embodiments may include an electronic display that is removable without disassembling the base portion of the product demonstration fixture. For example, the base portion may include a slot or track into which the electronic display may be inserted. Later if replacement or substitution of the electronic display is required or desired, the electronic display may be removed.

Accordingly, a dynamically configurable product demonstration fixture may be formed by integrating, either temporarily or permanently, an electronic display below a cover affixed to a base portion. Thus, the product demonstration fixture may be used to advertise a plurality of features and configurations of an electronic device offered for sale.

In these and related embodiments, the product demonstration fixture may be configured to provide and present purchase information related to the portable electronic device offered for sale. Purchase information may include price, availability, configuration options, colors, accessories, compatible third party applications or devices, and the like. The product demonstration fixture may present the purchase information on the display as an image, text, animation, presentation, or any combination of the like. In many examples, the potential customer may interact with the purchase information. For example, a customer considering purchase may touch the product demonstration fixture in order to instruct the product demonstration fixture to change the information presented on the display.

Customer interaction with the product demonstration fixture may be facilitated at least in part by the processor of the electronic display. In one example, the processor may present pricing information on the display along with an instruction for the potential customer to touch an area of the display if the customer desires more information related to price. Upon receiving an indication that the potential customer has touched the area, the processor may present additional pricing information on the display of the product demonstration fixture.

In many examples, purchase information presented by the product demonstration fixture may be changed from time to time with or without interaction by a potential customer. For example, the product demonstration fixture may present pricing information for a selected period of time before changing to present product availability information. In many examples, a product demonstration fixture may be adapted to provide an aesthetically pleasing animation upon transitioning between presentations of different purchase information.

In many embodiments, the product demonstration fixture may mimic a portable electronic device that interacts with the portable electronic device offered for sale. For example, the portable electronic device offered for sale may be an accessory device such as a Bluetooth headset. The product demonstration fixture in this example may mimic a cellular telephone that is adapted to interact with the Bluetooth headset offered for sale. In such an example, the customer considering purchase may desire to experience a plurality of interaction use cases between the cellular phone and the Bluetooth accessory. In such an example, the product demonstration fixture may imitate the cellular telephone such that the potential customer may experience the process of connecting the accessory to the cellular phone prior to purchase. In other examples, the potential customer may desire to experience the interaction of the two devices during the process of receiving a telephone call or a text message, or any number of other possible interaction use cases.

The product demonstration fixture may be configured to mimic or otherwise simulate a plurality of interaction use cases with a plurality of electronic devices. For example, a potential customer considering purchase may be able to select among a plurality of cellular phones for the electronic display to mimic. For example, a user considering purchase may be presented with a menu or other graphical user interface for selecting an electronic device for the product demonstration fixture to mimic. In one example, the customer may select an electronic device that the customer is already familiar with. In this manner, the customer may be able to test and inspect various use cases of the portable electronic device offered for sale prior to purchase.

As noted above, the electronic display may, in some embodiments, be an off-the-shelf item that a potential customer may have familiarity with. In this example, the product demonstration fixture includes, and thus does not need to imitate or mimic, a portable electronic device that is configured to interact with the portable electronic device offered for sale. In such an embodiment, the electronic display may directly interact with the portable electronic device offered for sale because the electronic display is (and thus need not simulate) an electronic device configured for interaction.

To facilitate communication between the electronic display and the portable electronic device offered for sale, certain embodiments may include an auxiliary controller board within the product demonstration fixture. The auxiliary controller board may be communicably coupled to the processor of the electronic display and to the portable electronic device offered for sale. In many embodiments, the communicative coupling may be through a physical connection such as a data cable or, in some embodiments, may be through a wireless connection such as Bluetooth, Wi-Fi, or another wireless communication mechanism. In certain further embodiments, the communicative coupling between the electronic device and the auxiliary controller board may be through a combination of wireless and physical connections. For example in certain embodiments, a wireless connection may be unsuitable due to interference and latency concerns. In these examples, a wireless connection may be optionally disabled in favor of a physical connection that is not subject to interference or latency.

In some embodiments, the product demonstration fixture may be coupled to a power supply. The auxiliary controller board may distribute power from the power supply to the electronic display and to the portable electronic device offered for sale. In this manner, the auxiliary controller board may serve a secondary function of power distribution, monitoring, and management. In some examples, the power supply may be a battery or, in some embodiments, an external power supply. In many examples, the battery may be enclosed within the housing of the base of the product demonstration fixture.

In many cases, the internal battery that may be recharged by connecting the product demonstration fixture to an external power supply. In other examples, the product demonstration fixture may not include an internal battery. In such a case, the auxiliary controller board may receive and distribute power from the external power supply.

As described above, the product demonstration fixture may be used by a retail store in order to demonstrate a plurality of features of a portable electronic device offered for sale. For embodiments including an internal battery within the base of the product demonstration fixture, the internal battery may be selected having a capacity equal or greater than the operating hours of a retail store.

For example, the internal batteries may be large enough to provide power to the base portion, electronic display, processor, and the portable electronic device offered for sale for twelve to fourteen hours. The recharging of the internal battery may be facilitated at least in part by the auxiliary controller board.

As noted above, the auxiliary controller board may be communicably coupled to the electronic display and to the portable electronic device offered for sale. In this manner, communication between the electronic display and portable electronic device offered for sale may be achieved. For example, communication between the two devices may be desirable during a customer-selected interaction use case.

These embodiments may include a thin data cable coupled between the auxiliary controller board and the portable electronic device offered for sale. In many examples the data cable may be at least partially concealed from the customer by the elevating attachment of the product demonstration fixture. In certain cases, the data cable may communicably couple the electronic display to the portable electronic device offered for sale via the auxiliary controller board. In this manner, the auxiliary controller board may facilitate communication between the portable electronic device offered for sale and the electronic display, such as communication related to the simulated interaction use cases described above.

For one example, to simulate an incoming phone call between a mimicked cellular phone and a Bluetooth accessory device, the electronic display may send a signal via the data cable to the accessory, instructing the Bluetooth accessory to simulate an incoming phone call. If a potential customer considering purchase interacts with the Bluetooth accessory to accept the simulated incoming call, the Bluetooth accessory may send a signal via the data cable back to the electronic display, instructing the electronic display to simulate an accepted incoming phone call on the mimicked cellular phone.

In still further examples the data cable may also be adapted to provide power to the portable electronic device offered for sale. In many examples, the auxiliary controller board may be configured to provide power to the electronic device via the data cable.

Certain further embodiments may use well-known and familiar connectors for the data cable. Still some embodiments may use the same connectors to provide all circuit-to-circuit connections within the product demonstration fixture. For example, the data cable may include a male Universal Serial Bus ("USB") connector for coupling to a circuit board associated with the auxiliary controller board. Similarly, the electronic display may couple to the same circuit board using a male USB connector.

In this manner, familiar connectors may allow for improved assembly times as well as improved repair times in both a retail and manufacturing environment. In such an example, the expertise required of a retail employee tasked with assembling a product demonstration fixture is substantially reduced. Similarly, if a retail employee is tasked with replacing or substituting the portable electronic device offered for sale associated with a particular product demonstration fixture, familiar connectors may reduce the possibility that the retail employee will require advanced training to assemble or disassemble the product demonstration fixture.

One may appreciate that although examples provided herein may relate to cellular telephones and accessory devices, other simulated interactions are contemplated and may vary from embodiment to embodiment. For example, the electronic display may be configured for mimicking or simulating a tablet computer, a personal computer, an accessory device, personal digital assistants, tablet computers, laptop computers, track pads, wearable devices, health devices, sports accessory devices, peripheral input devices, and so on.

Similarly, the portable electronic device offered for sale and affixed to the elevating attachment of the product demonstration fixture may also be a tablet computer, a personal computer, an accessory device, personal digital assistants, tablet computers, laptop computers, track pads, wearable devices, health devices, sports accessory devices, peripheral input devices, and so on.

In many examples, the portable electronic device offered for sale may be rigidly secured to the base of the product demonstration fixture with an exhibition feature. In certain embodiments, a secure fixture may rigidly couple the portable electronic device to the base portion of the product demonstration fixture. The coupling may be accomplished by any number of suitable mechanical means. For example, screws, pins, or adhesives may be used to attach the portable electronic device to the exhibition portion, which in turn may be similarly affixed to the base portion.

In certain embodiments, the elevating attachment may be permanently affixed to the base portion. In some embodiments, the elevating attachment may be removably affixed to the base portion. In such an example, an elevating attachment may be removed, substituted, or replaced from time to time.

In still further embodiments that product demonstration fixture may include an external data connection. The data connection may couple to the auxiliary controller board or to one or both of the electronic display and the portable electronic device. In certain examples, the external data connection may provide updates to the systems to which it is connected. For example, in one embodiment, a software or firmware update may be pushed via the external data connection through the auxiliary controller board to the portable electronic device offered for sale. In this manner, a display model may always include the same software experience as the portable electronic devices available for retail purchase.

In other examples, the external data connection may be adapted to update the information stored by the memory of the electronic display. For example, in certain cases, the external data connection may provide for price updates, sale information updates, availability updates, or general advertising material updates to the electronic display. In other cases, the external data connection may provide for firmware, software, or operating system updates to the electronic display. In this manner, a retail store may update each product demonstration fixture to include identical content and software.

In some embodiments, the product demonstration fixture may connect to the external data source via a wireless connection such as Bluetooth or Wi-Fi. In other examples, the product demonstration fixture may connect to the external data source via a physical connection such as a USB connection.

As with the connections internal to the product demonstration fixture described herein, many embodiments may include a familiar connector such as a USB connector in order to connect the product demonstration fixture to the external data source. In this manner, a retail employee may be capable to update the product demonstration fixture and the portable electronic device offered for sale with a single connector and without specialized training.

FIG. 1 depicts a front perspective view of an example product demonstration fixture for displaying and anchoring a portable electronic device. The product demonstration fixture 100 includes a base 102. The base 102 may include an upper layer and a bottom layer, a cover 106 and a foot 116 respectively. The cover 106 may be made from a material selected, at least in part, for its resiliency. The cover 106 may be made, for example, from a resilient and aesthetically pleasing material such as glass. The material may be selected based on one or more characteristics of the material that allow the material to be used for continued handling. For example, the material may be resistant to scratches, smudges, or collection of debris.

In many examples, an optically opaque ink layer may be disposed on one or more surfaces of the cover 106 in a pattern. For example, the ink may be disposed on a bottom surface of the cover 106 so as to define an aperture that is not optically obscured. This aperture may be sized to border an electronic display 104 positioned within the base portion and below the cover 106. In this manner, such an aperture may be referred to as a display window.

The base 102 may also include a foot 116. The foot 116 may cover entirely or partially, a bottom surface of the base 102. The foot 116 may be removably coupled to the base 102. For example, in certain embodiments, the foot 116, may be magnetically attracted to the base 102. In other examples, the foot 116 may be adhered with a removable adhesive. In still further examples, the foot 116 may be adapted to friction fit about certain surface features included within the base 102.

In many examples, the foot 116 may be made of, or include an exterior coating of, a low-friction material. For example, in certain embodiments, the base 102 may be adapted to slide about a display table such that individual customers may adjust the position of the product demonstration fixture 100. In such an embodiment, the low-friction of the foot 116 may facilitate easier sliding across the surface of the display table.

In other examples, the foot 116 may be made from, or include an exterior coating of, a high-friction material. For example, in certain embodiments, the base 102 may be adapted to substantially retain its position on a display table. In other examples, the foot 116 may be adhered or otherwise permanently affixed to a display table.

The product demonstration fixture 100 may also include an elevating attachment 108. The elevating attachment 108 may be at least partially secured to the base 102 by a retaining mechanism (not shown). In certain embodiments the elevating attachment may be at least partially obscured from the view of the customer by the portable electronic device 112 offered for sale. For example, in certain embodiments, a portable electronic device 112 may include an obscuring portion 110 that entirely or partially hides the elevating attachment 108.

In many examples, the portable electronic device 112 may include a display 114 with which a customer considering purchase may interact.

Figure 2:
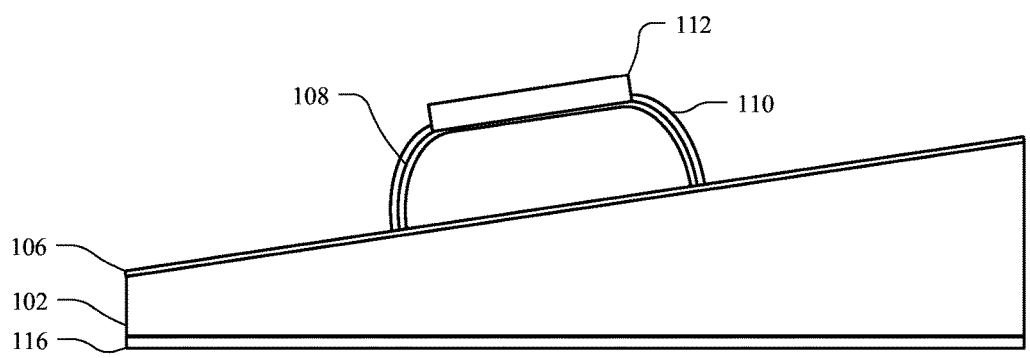
FIG. 2 depicts a side view of the example product demonstration fixture of FIG. 1.

FIG. 2 depicts a side view of the example product demonstration fixture 100 of FIG. 1. In this view the elevating attachment 108 is shown as having a substantially arcuate shape. It may be appreciated that the shape of the elevating attachment 108 may be different for different portable electronic devices 112. For example, certain embodiments may include an elevating attachment 108 with an angular, a conical, a spherical, a hemispherical, rectangular, or other suitable shape.

In many embodiments the elevating attachment 108 may be constructed from a durable metal. In further embodiments, the elevating attachment 108 may be made from an optically clear material such as acrylic or glass. In still further embodiments, the elevating attachment 108 may be solid through the cross-section 3-3 as shown in FIG. 1. For example, in lieu of an arcuate shape, the elevating attachment 108 may, in some embodiments, take a semi-circular shape. One may appreciate that a number of shapes and materials may be considered suitable for particular embodiments of the elevating attachment 108.

Figure 3:
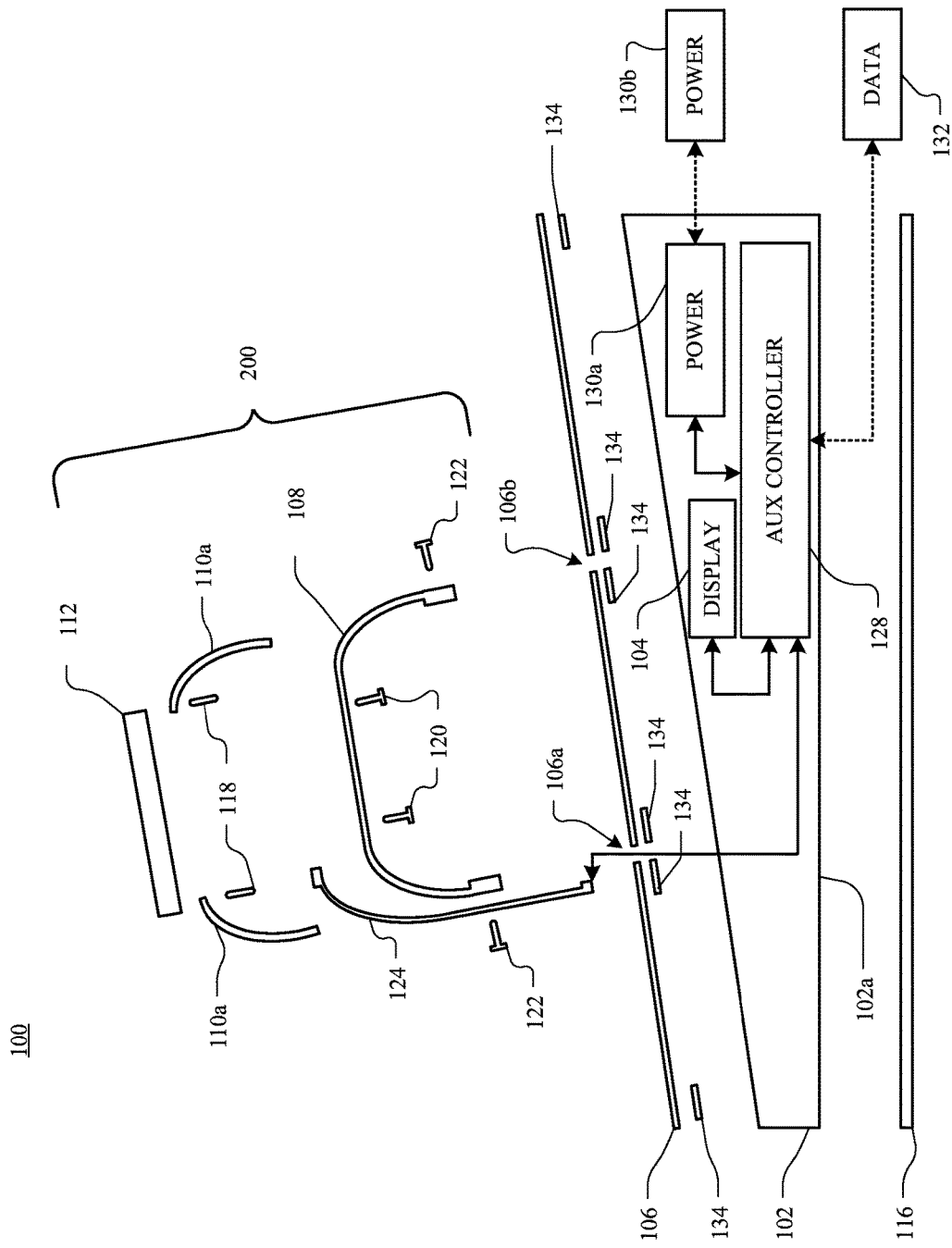
FIG. 3 depicts an exploded side view of the example product demonstration fixture of FIG. 1 taken along line 3-3.

FIG. 3 depicts an exploded side view of the example product demonstration fixture 100 of FIG. 1 taken along line 3-3. In this view, the securing mechanism of the elevating attachment 108 is shown. For example, the portable electronic device 112 may be attached to obscuring portions 110a, 110b via insertion of pins 118. In this manner, the obscuring portions 110a, 110b may be prevented from laterally detaching from the portable electronic device 112. In some embodiments, the obscuring portions 110a, 110b may be provided to aesthetically improve or otherwise obscure a data cable 124 having at least two connectors. In some embodiments, the obscuring portions 110a, 110b may be provided as an accessory feature related to the portable electronic device 112. For example, if the portable electronic device 112 offered for sale is a blood pressure monitor, the obscuring portions 110a, 110b may represent portions of the inflatable arm band. In other examples, if the portable electronic device 112 is an intelligent pet tracker, the obscuring portions 110a, 110b may represent portions of a collar.

Positioned below the obscuring portions 110a, 110b and the pins 118 may be the elevating attachment 108. The elevating attachment 108 may be secured into the portable electronic device 112 by a mechanical attachment, such as screws 120. In this manner, the elevating attachment 108 may secure the pins 118 and the obscuring portions 110a, 110b to the portable electronic device 112.

In some embodiments, a data cable 124 may be disposed between the elevating attachment 108 and an obscuring portion 110a. The data cable 124 may include a connector at one end that is sized to match with a data port included within the portable electronic device 112. For example, in certain embodiments, the connector may include several pogo pins which are positioned to align with several exposed contacts of the data port. Accordingly, when the screw or screws 120 are inserted through the elevating attachment 108 into the portable electronic device 112, the data cable 124 may be rigidly attached and communicably coupled to the portable electronic device 112.

In many examples, the cable 124 may be entirely hidden from the view of the customer, as it is sandwiched between the elevating attachment 108 and the obscuring portion 110a. Once inserted, the obscuring portions 110a and 110b may be secured to the elevating attachment 108 via screws 122.

In many examples, the obscuring portions 110a and 110b can be made from an organic material such as leather or cotton. In other cases, the obscuring portions 110a and 110b can be made from a synthetic material such as nylon or another polymer. In still further examples, the obscuring portions 110a and 110b can be made from an inorganic material such as a metal. In some examples, such as illustrated, the obscuring portions 110a and 110b may be separated from one another. In other examples, the obscuring portions 110a and 110b may be formed as a unitary element, forming a portion of a loop. In these cases, the obscuring portions 110a and 110b can extend into the product demonstration fixture 100.

The portable electronic device 112, the obscuring portion 110a and 110b, the data cable 124, and the elevating attachment 108 may be assembled together as a secure merchandise assembly 200.

In many examples, the secure merchandise assembly 200 can be assembled rigidly so that the electronic device 112 is prevented from moving relative to the product demonstration fixture 100. In other examples, however, the secure merchandise assembly 200 can be assembled with movement tolerance specifically so that the electronic device 112 can move during a product demonstration. For example, in some embodiments, the electronic device 112 can include a haptic feedback element suited to provide haptic feedback to a user of the electronic device 112. In these examples, the secure merchandise assembly 200 can be assembled so that the device can move during demonstration of the haptic feedback features of the electronic device 112.

The secure merchandise assembly 200 may, as a unit, be inserted through the cover 106 through two apertures 106a and 106b. The apertures 106a, 106b may be sized to receive a bottom portion of the secure merchandise assembly 200. Once inserted into the cover apertures, the secure merchandise assembly 200 may be screwed to the housing of the base 102 (not shown) or into a portion of a cover frame 134. The cover frame 134 may be adhered to the cover 106 with an adhesive. The cover frame 134 may be affixed to the housing of the base 102 using any suitable means such as, for example, screws, adhesive, or a combination of the like.

The base 102 may include an electronic display 104 that may be communicably coupled to an auxiliary controller board 128. The auxiliary controller board 128 may be tasked with providing both power and data via the data cable 124 to the portable electronic device 112. Similarly, the auxiliary controller board 128 may be tasked with providing both power and data to the display 104.

In some embodiments the base 102 may include an internal power source 130a, such as a battery pack. In many examples, the battery pack may include more than one individual battery, each of which may be rechargeable batteries. By optionally coupling the internal power source 130a to an external power source 130b, the internal power source 130a may be recharged.

In certain further examples the auxiliary controller board 128 may facilitate, control or otherwise regulate the charging of the internal power source 130a. For example, the auxiliary controller board 128 may monitor the voltage of individual cells of each individual battery pack of the internal power source 130a to ensure that uniform charging across all cells is accomplished. In many examples, monitoring by the auxiliary controller board 128 may be accomplished by communicably coupling the auxiliary controller board 128 to battery management units associated with each individual battery cell.

The auxiliary controller board 128 may also be optionally coupled to an external data source 132. The external data source 132 may couple to the auxiliary controller board 128 or to one or both of the electronic display 104 and the portable electronic device 112. In certain examples, the external data source 132 may provide updates to the systems to which it is connected. For example, in one embodiment, a software or firmware update may be pushed via the external data source 132 through the auxiliary controller board 128 to the portable electronic device 112. In this manner, a display model may always include the same software experience as the portable electronic devices available for retail purchase.

In other examples, the external data source 132 may be adapted to update the information stored by the memory of the electronic display 104. For example, in certain cases, the external data source 132 may provide for price updates, sale information updates, availability updates, or general advertising material updates to the electronic display. In other cases, the external data source 132 may provide for firmware, software, or operating system updates to the electronic display 104. In this manner, a retail store may update each product demonstration fixture to include identical content and software.

In some embodiments, the auxiliary controller board 128 may connect to the external data source 132 via a wireless connection such as Bluetooth or Wi-Fi. In other examples, the auxiliary controller board 128 may connect to the external data source 132 via a physical connection such as a USB connection.

In many embodiments the several electrical communication connections within the base 102 between the electronic display 104, the portable electronic device 112, the data cable 124, the auxiliary controller board 128, and the internal power supply 130*a* may use well-known and familiar connectors for the data cable. For example, the data cable 124 may include a male USB connector for coupling to a circuit boarding associated with the auxiliary controller board 128. Similarly, the electronic display 104 may couple to the same circuit board using a male USB connector.

Positioned below the base 102 may be the foot 116. The foot 116 may mechanically adhere to a bottom surface 102*a* of the base 102. In many examples, the foot 116 may at least partially obscure a connection to the external data source 132. For example, the connection to an external data source 132 may include a data port that would be undesirable to expose to customers. Accordingly, in certain embodiments, such a data port may be positioned on the bottom surface 102*a* of the base 102.

Figure 4:
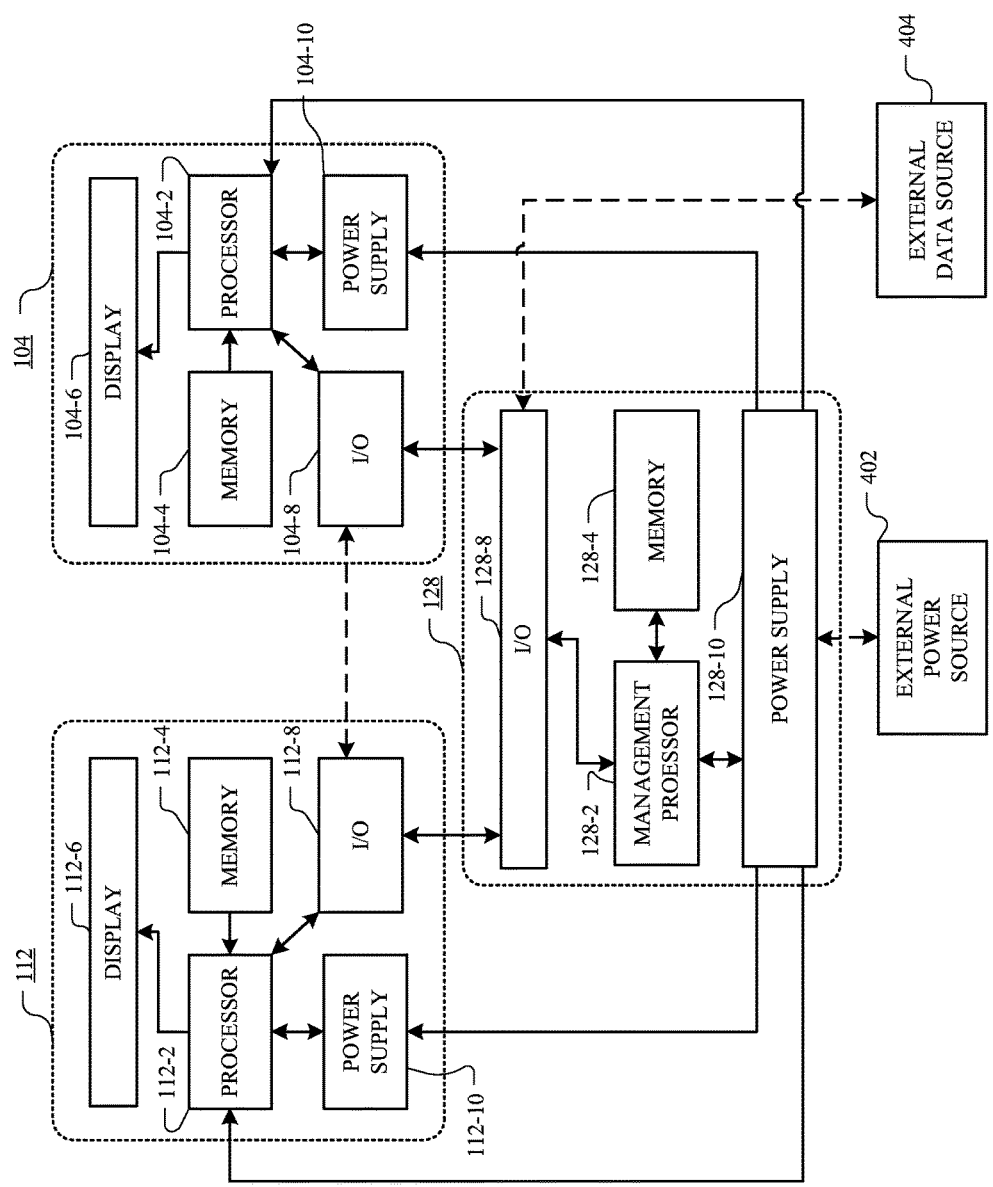
FIG. 4 depicts an example signal flow diagram of the example electronic product demonstration fixture for displaying and anchoring a portable electronic device.

FIG. 4 depicts an example signal flow diagram of the product demonstration fixture for displaying and anchoring a portable electronic device. In this signal flow diagram, the interactions between the various components of the product demonstration fixture are illustrated. For example, the electronic display 104 may include a display unit 104-6, coupled to a processor 104-2 which itself is coupled to a memory 104-4, a power supply 104-10, and an input/output mechanism 104-8.

Similarly, the portable electronic device 112 may include a display unit 112-6, coupled to a processor 112-2 which itself is coupled to a memory 112-4, a power supply 112-10, and an input/output mechanism 112-8.

The auxiliary controller board 128 may similarly include a processor 128-2 which is coupled to a memory 128-4, a power supply 128-10, and an input/output mechanism 128-8. In some embodiments, the power supply 128-10 may be coupled to an external power source 402. The external power source 402 may be an external battery or an external connection to a power transformer or power outlet. In certain examples the external connection to the external power source 402 may be made by a standard power connector, for example, a barrel connector or a magnetically-attracted pogo pin connector.

In addition, the internal power supply 128-10 may be connected to the power supplies of the display 104 and the portable electronic device 112, which are 104-10 and 112-10 respectively. In this manner, power may be transferred from the internal power supply 128-10 to the internal power supplies 104-10 and 112-10. For example, the internal power supply 128-10 may be configured to charge the internal power supplies 104-10 and 112-10.

In another embodiment, the internal power supply 128-10 may be directly connected to the processors 112-2 and 104-2. In this manner, the internal power supply 128-10 may operate both the electronic display 112 and the portable electronic device 112 even if either or both of the internal power supplies 104-10 and 112-10 are completely depleted. In this embodiment, the internal power supply 128-10 may operate as an auxiliary or backup battery.

The input/output mechanism 128-8 may be coupled to the input/output mechanisms 104-8 and 112-8 of the electronic display 104 and the portable electronic device 112. In some embodiments, the input/output mechanisms 104-8 and 112-8 of the electronic display 104 and the portable electronic device 112 may be directly coupled to one another. In this manner, the electronic display 104 and the portable electronic device 112 may communicate.

Figure 5A:
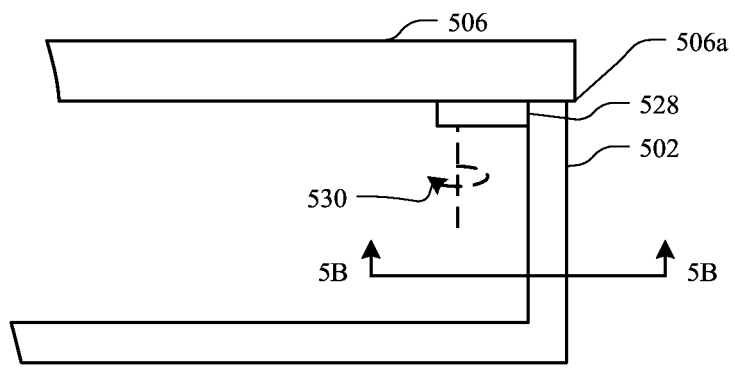
FIG. 5A depicts a side view of a portion of an example product demonstration fixture showing an alignment feature for positioning a cover glass flush with the exterior surface of the housing of the base.

FIG. 5A depicts a side view of a portion of an example product demonstration fixture showing an alignment feature 528 for positioning a cover 506 that has a misaligned area 506*a* (e.g., not flush) with respect to an outer surface of the base 502. In this embodiment the alignment feature 528 may be fixedly adhered to the surface of the cover 506. However, although the alignment feature 528 is adhered to the cover 506, the alignment feature 528 may be configured to rotate about an axis 530. The axis 530 may not be positioned in the center of the alignment feature 528. In this manner, when the alignment feature 528 rotates about the axis 530, it may provide a cam-action force against the housing of the base 502. In this manner, the cover 506 may pull back, slightly, in response to the cam-action force. Adjustment of the alignment feature 528 may allow the cover 506 to be carefully aligned with the outer surface of the base 506.

Figure 5B:
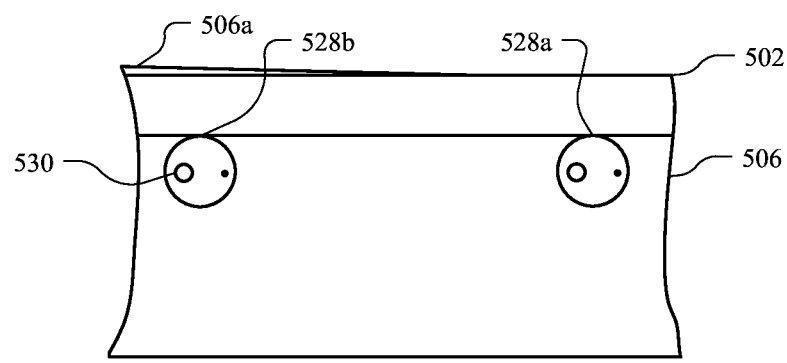
FIG. 5B depicts a bottom view of a portion of an example product demonstration fixture showing two alignment features for positioning a misaligned cover glass flush with the exterior surface of the housing of the base.
Figure 5C:
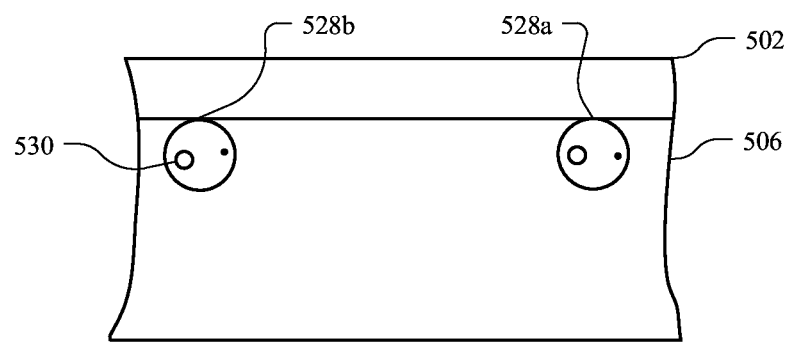
FIG. 5C depicts a bottom view of a portion of an example product demonstration fixture showing two alignment features for positioning a cover glass flush with the exterior surface of the housing of the base.

FIG. 5B depicts a bottom view taken along line 5B-5B of FIG. 5A of a portion of an example product demonstration fixture showing two alignment features for positioning a misaligned cover glass flush with the exterior surface of the housing of the base. This embodiment shows two alignment features 528*a*, 528*b*, each showing the axis of rotation 530 and one alignment fiducial. As illustrated, the alignment feature 528*b* may be rotated slightly toward the housing of the base 502. In this manner, the misaligned area 506*a* of the cover 506 adjacent to the alignment feature 528*b* may pull back into flush alignment with the surface of the housing of the base 502, as shown for example in FIG. 5C.

Figure 6:
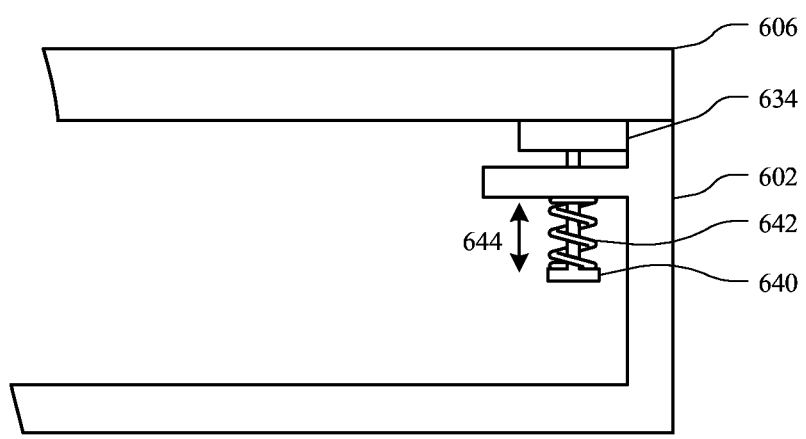
FIG. 6 depicts a side view of a portion of an example product demonstration fixture showing a retention feature for retaining a cover glass flush with the exterior surface of the housing of the base.

FIG. 6 depicts a side view of a portion of an example product demonstration fixture showing a retention feature for retaining a cover 606 flush with the exterior surface of the housing of the base. In such an embodiment a screw 640 may affix the cover 606 to the housing of the base 602 by drilling into a cover frame 634. However, over time, the screw 640 may eventually creep out of desirable tightness, potentially loosening the cover 606. A loosened cover 606 may laterally drift and may not necessarily stay flush with the housing of the base 602. Accordingly, the screw 640 may include a biasing spring 642 which may constantly provide expansive pressure 644. In this manner, even if the screw 640 loosens, the cover 606 may remain tightly coupled and flush with the housing 602.

Figure 7:
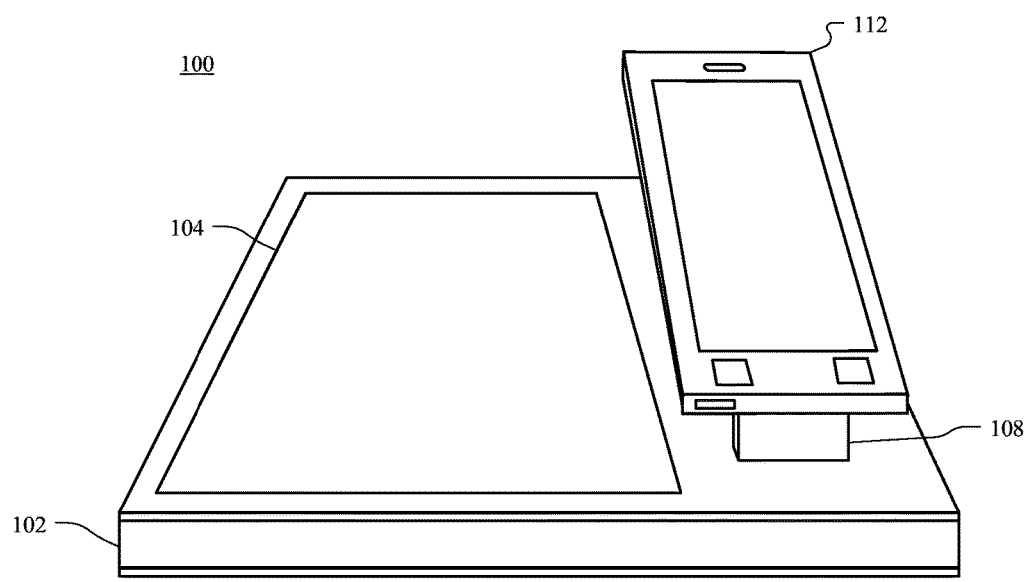
FIG. 7 depicts a front perspective view of an example product demonstration fixture for displaying and anchoring an alternate portable electronic device.

FIG. 7 depicts a front perspective view of an example product demonstration fixture 100 for displaying and anchoring an alternate portable electronic device 112, such as a cellular phone. As with the example embodiment shown in FIG. 1, the product demonstration fixture 100 includes a base 102. The base 102 may include an upper layer and a bottom layer, a cover and a foot respectively. The portable electronic device 112 may be rigidly affixed to the product demonstration fixture 100 by an elevating attachment 108. Within the elevating attachment may be included a data cable for transferring data between the product demonstration fixture 100 and the portable electronic device 112.

Figure 8:
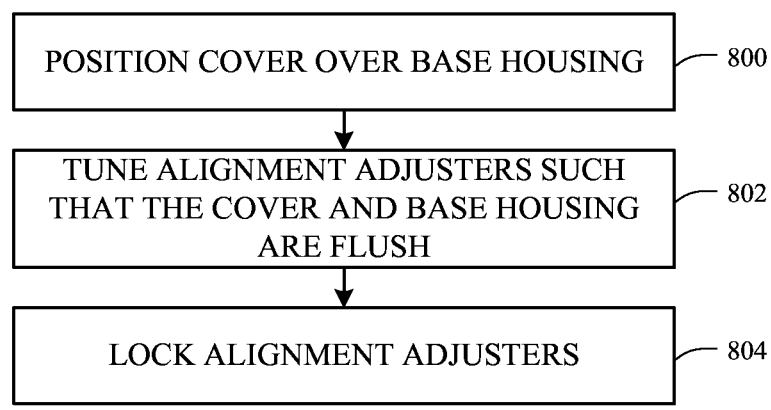
FIG. 8 depicts an example flow chart of a method of aligning a cover portion with a housing such that the cover and the housing are flush.

FIG. 8 depicts an example flow chart of a method of aligning a cover portion with a housing such that the cover and the housing are flush. The method may begin at step 800 in which a cover may be positioned over the housing. Thereafter, at 802, a plurality of alignment adjusters may be tuned such that the cover and the base are flush. Lastly at 804, the several alignment adjusters may be locked into position. In this manner, the cover may be prevented from being laterally displaced over the operational life of the relationship between the cover and the housing.

Figure 9:
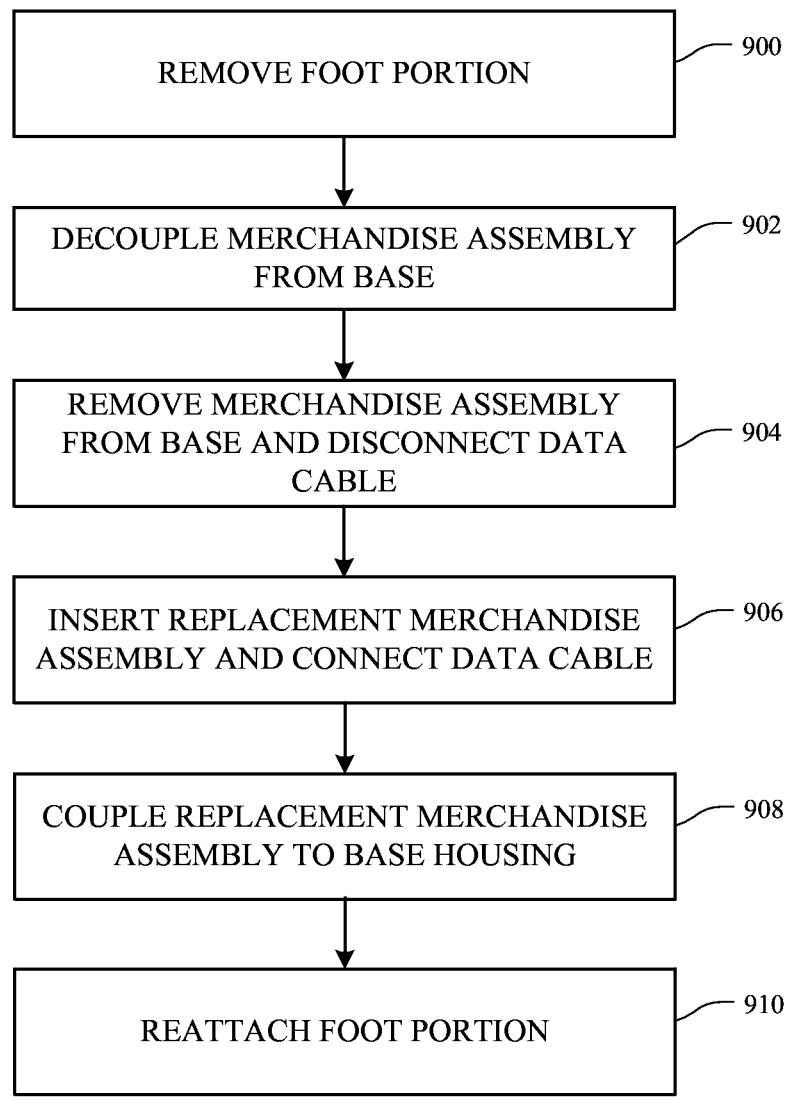
FIG. 9 depicts an example flow chart of a method of exchanging an electronic device coupled to a product demonstration fixture.

FIG. 9 depicts an example flow chart of a method of exchanging an electronic device coupled to a product demonstration fixture. The method may begin at step 900 in which a foot portion associated with the base may be removed. For example the foot portion may be adhered or otherwise attached to the base via magnetic attraction. Once the foot portion is removed, the merchandise assembly may be decoupled from the base at step 902. In many examples, removal of the merchandise assembly may be accomplished by unscrewing one or more screws affixing the merchandise assembly to the base. Next at step 904, the decoupled merchandise assembly may be removed from the base. Next, at step 906, a replacement merchandise assembly may be inserted into the space left by the first merchandise assembly. Thereafter the replacement merchandise assembly may be coupled to the base housing at 908. Lastly, at 910, the foot portion may be reattached.

Figure 10:
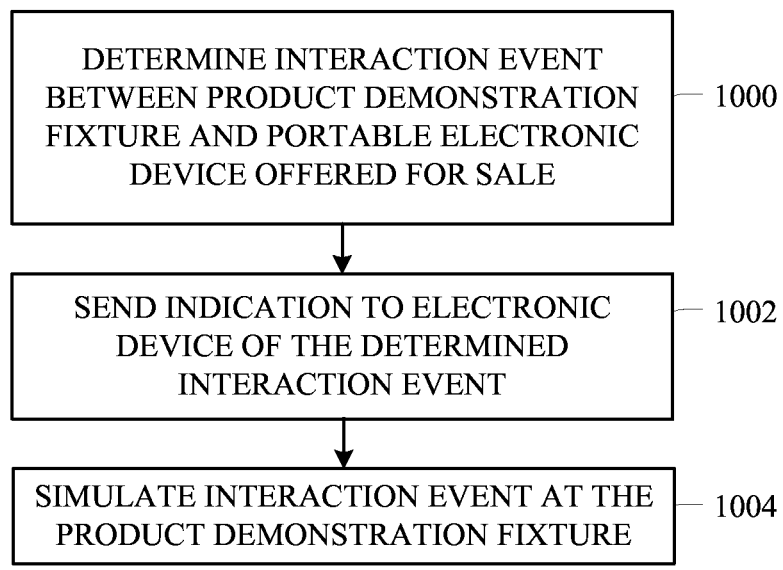
FIG. 10 depicts an example flow chart of a method of simulating interaction between an electronic device offered for sale and a second electronic device included within or simulated by a product demonstration fixture.

FIG. 10 depicts an example flow chart of a method of simulating interaction between an electronic device offered for sale and a second electronic device included within or simulated by a product demonstration fixture. The method may begin at step 1000 in which an interaction event is determined between a product demonstration fixture and a portable electronic device offered for sale. The interaction event may be a simulation of an example interaction between the two devices. Next at step 1002, an indication may be sent to the portable electronic device that a particular interaction event is desired. In this manner, the portable electronic device may demonstrate its portion of the interaction event. The method may conclude at 1004 in which the product demonstration fixture may demonstrate its portion of the interaction event.

Figure 11:
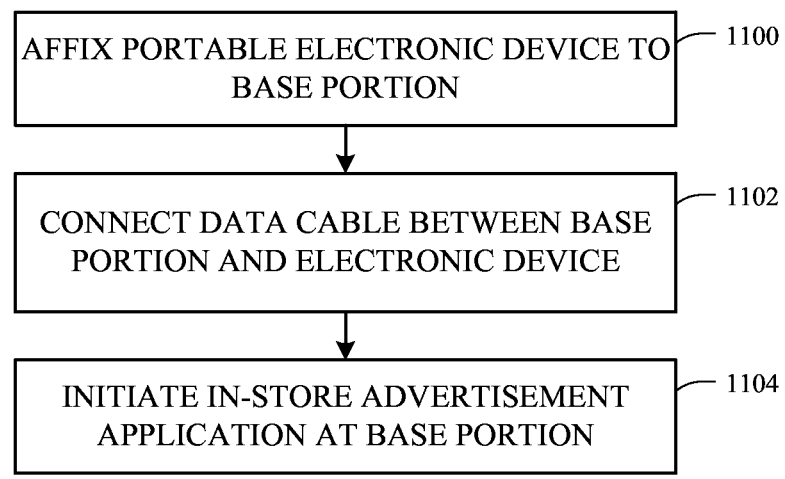
FIG. 11 depicts an example flow chart of a method of presenting an electronic device offered for sale.

FIG. 11 depicts an example flow chart of a method of presenting an electronic device offered for sale. The method may begin at 1100 by affixing a portable electronic device to a base portion of a product demonstration fixture. Next, at 1102, a data cable may be coupled between the base portion of the product demonstration fixture and the portable electronic device affixed thereto at 1100. The method may complete at 1104 in which an in-store advertisement application is initiated. For one example, a pre-recorded video or presentation may begin to play on the product demonstration fixture.

Figure 12:
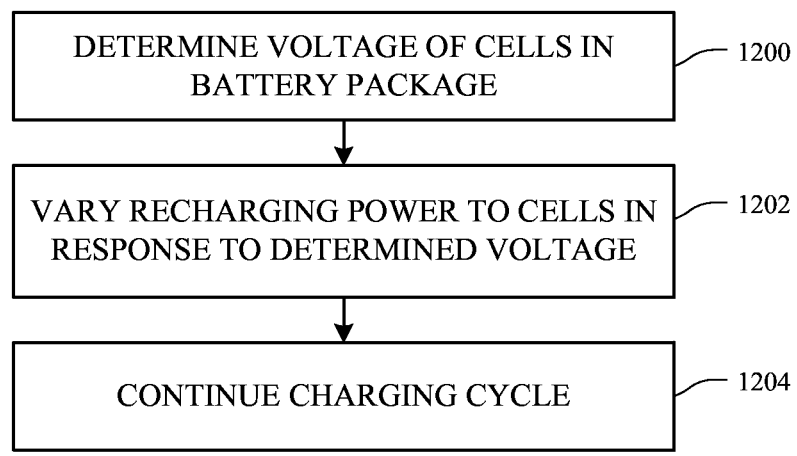
FIG. 12 depicts an example flow chart of a method of charging an auxiliary battery of a product demonstration fixture.

FIG. 12 depicts an example flow chart of a method of charging an auxiliary battery of a product demonstration fixture. The method may begin at 1200 in which the voltage or current capacity of each battery cell within each of several battery packs may be determined. For example, in certain embodiments, more than one battery pack with more than one battery cell may be included within a product demonstration fixture. A processor coupled to the battery pack may be configured for measuring the voltage presented by the included batteries. In this manner, both charging and loading of the several batteries may be distributed intelligently to prevent self-damage to individual cells.

In many examples the processor may determine that an individual cell should be charged at a higher rate or a lower rate than other cells. Accordingly, the processor may at step 1202 vary the recharging power to each of the several cells in response to the measured voltage. In these examples, such per-cell regulation of charging and discharging may improve the overall capacity of the battery pack included within the product demonstration. In certain embodiments, the product demonstration fixture may be configured for constant operation for fourteen hours or more. The process may conclude after the adjustments of step 1202 by continuing the charging cycle at 1204.

Figure 13:
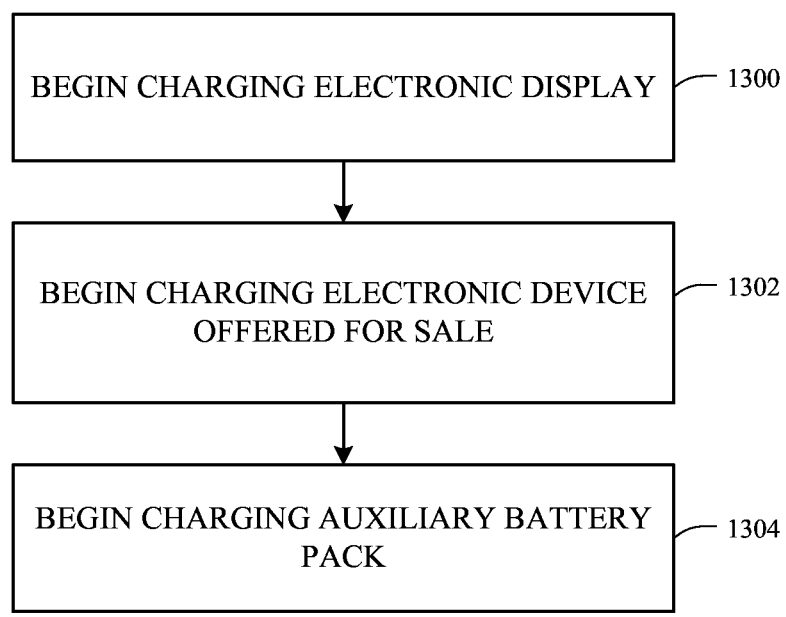
FIG. 13 depicts an example flow chart of a method of charging an auxiliary battery and an internal battery of an electronic display associated with a product demonstration fixture.

FIG. 13 depicts an example flow chart of a method of charging an auxiliary battery and an internal battery of an electronic display associated with a product demonstration fixture. Certain embodiments described herein related to a product demonstration fixture that includes an electronic display, an auxiliary controller, and a portable electronic device offered for sale. The auxiliary controller may include a battery pack that may be used to operate both the electronic display and the portable electronic device offered for sale. In other examples, both the electronic display and the portable electronic may include batteries as well.

In these cases, at least three batteries may be present within the product demonstration fixture. In such examples, it may be desirable to charge one battery at a time. For example, in certain embodiments, the battery included within the electronic display may be charged at step 1300. Once it is determined that the battery of the electronic display is fully charged, the battery of the portable electronic device offered for sale may be charged at 1302. Once it is determined that the battery of the portable electronic device offered for sale is charged, then the auxiliary battery may be charged at 1304. During the charging of the auxiliary battery, the battery of the electronic display and the portable electronic device offered for sale may be trickle charged at the rate of self-discharge. In this manner, a product merchandising fixture may be fully charged.

In many examples, a product merchandising fixture may be charged by connecting the fixture to mains (e.g., outlet) power. In certain embodiments, connecting the fixture to mains may be accomplished using a tethered charging connection. For example, the product merchandising fixture may include a charging receptacle to receive a power adapter or connector such as a barrel connector. In many embodiments, the receptacle may be hidden from the potential customer by a cover. In certain cases the cover may be sized to fit within the receptacle and sit flush with the exterior housing of the product merchandising fixture.

In some embodiments, the receptacle may be included below a removable foot of the product merchandising fixture. As described with respect to some embodiments disclosed herein, a removable foot may be adhered to a bottom surface of the product merchandising fixture. The foot portion may be adhered by magnetic attraction so as to be removable. Removal of the foot portion may expose the charging receptacle.

In still further embodiments, the charging receptacle may be another connector type separate from a barrel connector. For example, the charging receptacle may be a connector type that is common within the retail setting. For example, a retail setting for demonstrating laptop computers may include a number of adapters for charging laptop computers. In such an example, the charging receptacle of the product merchandising fixture may be compatible with the adapters otherwise used for charging laptop computers. In another example, in a retail setting for demonstration a USB device may include a number of adapters for charging via USB. In such an example, the charging receptacle of the product merchandising fixture may be USB-compatible. One may appreciate that the foregoing are merely examples of the type and sizing of the charging receptacle which may be included within a product merchandising fixture having an internal battery, and that other charging receptacles and methods are contemplated. For example, in certain embodiments, the product merchandising fixture may replenish the auxiliary battery contained therein via inductive charging.

Figure 14:
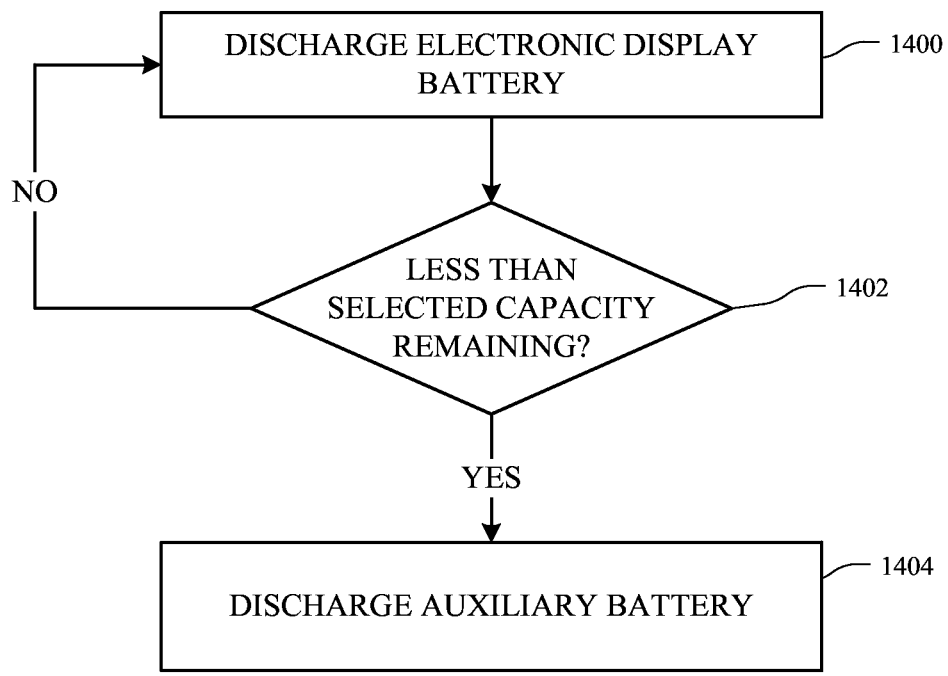
FIG. 14 depicts an example flow chart of a method of discharging an auxiliary battery and an internal battery of an electronic display associated with a product demonstration fixture.

FIG. 14 depicts an example flow chart of a method of discharging an auxiliary battery and an internal battery of an electronic display associated with a product demonstration fixture. As with FIG. 13, certain embodiments described herein relate to a product demonstration fixture that includes an electronic display, an auxiliary controller, and a portable electronic device offered for sale. The auxiliary controller may include a battery pack that may be used to operate both the electronic display and the portable electronic device offered for sale. In other examples, both the electronic display and the portable electronic may include batteries as well.

In many cases, the batteries contained within the electronic display may include a different capacity than the auxiliary battery or the battery within the portable electronic device offered for sale. Accordingly, certain embodiments may discharge smaller batteries before discharging the auxiliary battery.

For example, at step 1400 as shown in FIG. 14, the internal battery of the electronic display may be discharged before the auxiliary battery is discharged. For example, while the battery of the electronic device is discharged, a processor implementing the method may periodically determine the current power level of the battery of the electronic device at 1402. At this step, the processor may determine whether the capacity of the battery of the electronic device has fallen below a certain threshold. In certain examples, the threshold may be one percent of the full capacity of the battery.

If the battery of the electronic display falls below the threshold, the auxiliary battery may be coupled to the electronic display in order to operate the electronic display at 1404. In many embodiments, the auxiliary battery may not charge the depleted battery of the electronic display, but instead may directly power the electronic display.

A similar method may be employed between the battery of the portable electronic device offered for sale and the auxiliary battery.

One may appreciate that although many embodiments are disclosed above, that the operations presented with respect to methods and techniques described herein are meant as exemplary and accordingly are not exhaustive. One may further appreciate that alternate step order or, fewer or additional operations may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the some embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

We claim:

1. A demonstration fixture for a portable electronic device comprising:
    a base comprising:
        a housing comprising:
            a bottom surface; and
            a top surface oriented at an acute angle relative to the bottom surface;
        a cover glass disposed over the top surface and comprising:
            an opaque area;
            an optically transparent area; and
            an aperture within the opaque area;
        a display disposed within the housing and positioned below the optically transparent area of the cover glass;
        a processor coupled to the display and disposed within the housing; and
        a battery disposed within the housing and coupled to the processor;
    an elevating attachment positioned at least partially within the aperture of the cover glass configured to couple to the portable electronic device; and
    a cable at least partially concealed by the elevating attachment configured to couple the portable electronic device to a power supply;
    wherein the processor is in communication with the portable electronic device via the cable;
    wherein the portable electronic device comprises a battery and a display; and
    wherein the processor is configured to:
        monitor the power level of the battery of the portable electronic device, and
        direct power from the battery of the base to the portable electronic device upon determining that the power level of the battery of the portable electronic device is depleted at least to a selected battery threshold.

2. The demonstration fixture of claim 1, wherein the processor is configured to direct power from the battery of the base to the battery of the portable electronic device upon determining that the battery of the portable electronic device is depleted at least to the selected battery threshold.

3. The demonstration fixture of claim 1, wherein the processor is configured to directly power the display disposed within the housing upon determining that a battery of the display disposed within the housing is depleted at least to a selected battery threshold.

4. The demonstration fixture of claim 1, the base further comprising a port configured to couple to and receive power from an external power source.

5. The demonstration fixture of claim 1, wherein the processor is configured to direct power from an external power source to the battery of the base and to the battery of the portable electronic device.

6. The demonstration fixture of claim 1, wherein the portable electronic device comprises a wearable device.

7. The demonstration fixture of claim 1, the housing of the base further comprising an alignment adjuster configured to adjust the alignment of the cover glass with respect to the housing.

8. The demonstration fixture of claim 7, wherein the alignment adjuster comprises a rotatable member configured to apply a biasing force to the cover glass so as to align an edge of the cover glass with a sidewall of the housing.

9. The demonstration fixture of claim 1, wherein the elevating attachment at least partially separates the portable electronic device from the cover glass.

10. The demonstration fixture of claim 1, wherein the processor is configured to charge the battery of the base, the battery of the portable electronic device, and a battery of the display disposed within the housing during a charging sequence.

11. A demonstration fixture for a portable electronic device comprising:
- a base comprising a processor and a first battery disposed within the base;
- a display disposed at least partially within the base and comprising a second battery;
- an elevating attachment coupled to the base; and
- a portable electronic device secured to the elevating attachment, the portable electronic device comprising a third battery,
- wherein the first battery is coupled to the second battery and the third battery,
- wherein the processor is configured to:
  - monitor the power level of the second battery and the power level of the third battery,
  - direct power from the first battery to the second battery upon determining that the power level of the second battery is depleted at least to a selected battery threshold, and
  - direct power from the first battery to the third battery upon determining that the power level of the third battery is depleted at least to a selected battery threshold.

12. The demonstration fixture of claim 11, wherein the portable electronic device comprises a wearable device.

13. The demonstration fixture of claim 11, the base further comprising:
- a housing comprising a top surface and a bottom surface, the top surface comprising a display window;
- wherein the display is disposed within the housing and aligned with the display window.

14. The demonstration fixture of claim 11, wherein the elevating attachment is configured to hold the portable electronic device next to the display such that the portable electronic device and the display are disposed in a side-by-side relationship with the display disposed to the left of the portable electronic device.

15. The demonstration fixture of claim 11, wherein the portable electronic device is a wearable electronic device and wherein the wearable electronic device is coupled to the product demonstration fixture by an accessory of the wearable electronic device that extends over and hides the elevating attachment.

* * * * *